(12) United States Patent
Wirth

(10) Patent No.: US 6,982,797 B2
(45) Date of Patent: Jan. 3, 2006

(54) APPARATUS FOR DEVICES FOR DETERMINING PROPERTIES OF APPLIED LAYERS

(75) Inventor: Eckhard Wirth, Gelnhausen (DE)

(73) Assignee: Leybold Optics GmbH, Alzenau (DE)

( * ) Notice: Subject to any disclaimer, the term of this patent is extended or adjusted under 35 U.S.C. 154(b) by 361 days.

(21) Appl. No.: 10/347,715

(22) Filed: Jan. 20, 2003

(65) Prior Publication Data

US 2003/0147084 A1    Aug. 7, 2003

(30) Foreign Application Priority Data

Feb. 1, 2002    (DE)    ................................ 102 04 075

(51) Int. Cl.
  *G01B 11/06*    (2006.01)
(52) U.S. Cl. ........................ 356/630; 427/10; 427/162; 427/567; 118/665; 204/298.01
(58) Field of Classification Search ........ 356/630–632; 118/664, 665, 678, 698, 712, 715, 720; 204/298.03; 427/164–167, 294, 525, 10, 404, 566–567, 427/255.395, 419.2–419.3, 255.5

See application file for complete search history.

(56) References Cited

U.S. PATENT DOCUMENTS

| 4,140,078 | A | * | 2/1979 | Wilmanns .................... 118/665 |
| 4,240,311 | A | * | 12/1980 | Shinn ............................. 82/12 |
| 4,868,004 | A | * | 9/1989 | Zultzke et al. ............... 427/567 |
| 6,649,208 | B2 | * | 11/2003 | Rodgers ....................... 427/10 |
| 2002/0153247 | A1 | * | 10/2002 | Gibson .................. 204/298.01 |
| 2003/0180454 | A1 | * | 9/2003 | Hiraizumi et al. .......... 427/162 |

FOREIGN PATENT DOCUMENTS

| DE | 31 20 443 C2 | 5/1982 |
| DE | 37 42 204 A1 | 6/1989 |
| DE | 693 09 505 T2 | 7/1993 |
| DE | 43 14 251 A1 | 11/1994 |
| JP | 357051262 A | * | 3/1982 |

* cited by examiner

*Primary Examiner*—Hoa Q. Pham
(74) *Attorney, Agent, or Firm*—Fulbright & Jaworski L.L.P.

(57) ABSTRACT

The invention relates to an apparatus for devices for determining properties of thin layers applied on a substrate. This apparatus comprises two changing magazines wherein one magazine is provided for crystal resonators and the other magazine for test glasses. The changing magazine for crystal resonators has the form of a disk and is encompassed by the annular magazine for test glasses. Both can be rotated independently of one another. Each position of the magazines can be reproduced with the aid of sensors and evaluation devices. Consequently, it is possible to carry out multiple coatings.

15 Claims, 7 Drawing Sheets

APPARATUS FOR DEVICES FOR DETERMINING PROPERTIES OF APPLIED LAYERS

BACKGROUND AND SUMMARY OF THE INVENTION

Figure 1:
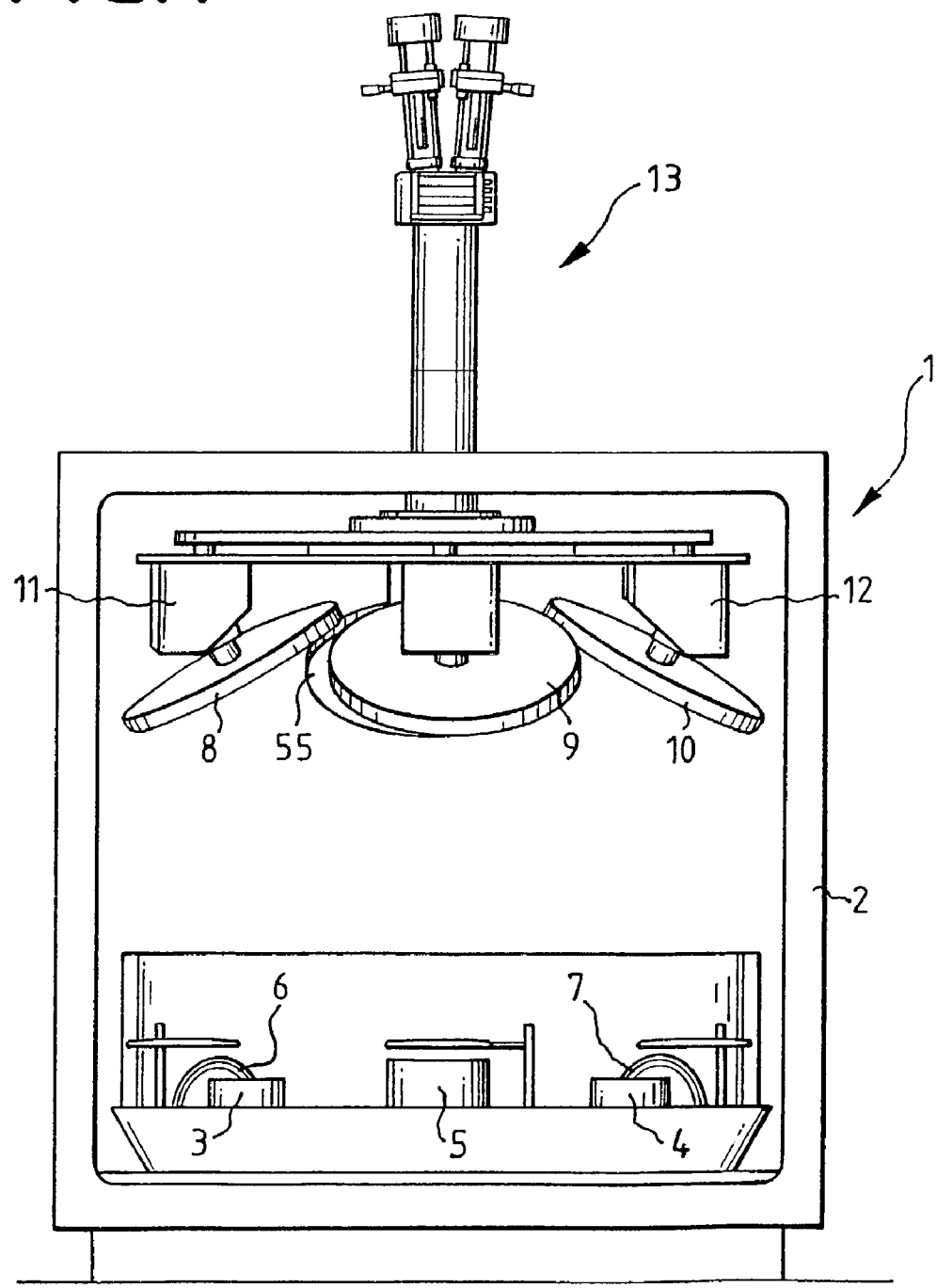

The invention relates to an apparatus for devices for determining properties of applied layers.

When coating substrates, for example optical lenses and glasses, it is important to acquire the properties of the applied layers, for example in order to be able to determine the time at which the coating is to be terminated. In particular multiple coatings, which are employed in the production of high-quality optical objects such as beam splitters, color conversion filters, cold light mirrors and laser mirrors, require highly precise measuring devices to ensure the quality and the reproducibility of the coatings. The physical properties which define the quality of thin layers are essentially the transmission, reflection, absorption, scattering, thermal stability and moisture resistance as well as the abrasion resistance and adhesiveness.

For determining the thickness and measuring the coating rate, i.e. of the mass applied per unit time, crystal oscillators are already known, whose crystal is coated in a manner similar to the substrate (DE 31 20 443 C2). Its mass is changed through the coating of the crystal, which, in turn, has an effect on the frequency of the crystal oscillator. The frequency change of the crystal oscillator is consequently a measure of the thickness of the deposited layer, while the frequency change per unit time can serve as a measure of the coating rate.

While the coating rate can be determined relatively precisely by means of a crystal oscillator, the measurement of the absolute layer thickness entails imprecisions such that for this purpose other measuring methods, for example optical ones, are preferred. In the case of optical measuring methods the applied thin layer is irradiated with a light beam and the reflected beam is compared with the irradiating beam. Based on the ratio of irradiating to emitted light beam it is possible inter alia to determine the thickness of the layer.

Thus, for measuring the transmission of an [epitaxially] grown layer on a test glass a spectral photometer is utilized (DE 43 14 251 A1) during the coating. The white light of a halogen lamp is conducted with a light waveguide to a vacuum lead-through with imaging optics and through the imaging optics imaged onto the test glass. A second vacuum lead-through with imaging optics images the transmitted light on a monochrometer or a line filter with succeeding detector.

It is also known to determine the growth of layers optically with the aid of a light source with detector and a test glass as well as also with the aid of crystal resonators (DE 37 42 204 A1).

It is further known that a light source emits a light beam with specific wavelength onto a film thickness control substrate, which is reflected onto a detector (DE 693 09 505 T2, corresponding to EP 0 552 648 B1). The quantity of light reflected from a film thickness control substrate varies as a function of the index of refraction and thickness of the thin film which has formed on the film thickness control substrate.

The invention addresses the problem of providing an apparatus with which the determination of the properties of a layer by means of a crystal oscillator and an additional optical method is carried out.

This problem is solved according to the present invention.

The invention consequently relates to an apparatus for devices for determining properties of thin layers, which are applied onto substrates. This apparatus comprises two changing magazines with one magazine being provided for crystal resonators and the other for test glasses. The changing magazine for crystal resonators has the form of a disk and is encompassed by the annular magazine for test glasses. Both can be rotated independently of one another. With the aid of sensors and evaluation devices each position of the magazines can be reproduced. Therewith it is possible to carry out multiple coatings.

One advantage attained with the invention comprises that it can be applied with an online process regulation or with the precise determination of switch-off conditions during the epitaxial growth of thin layers in order to measure the reflection or transmission on test glasses or on the substrate itself.

A further advantage of the invention comprises that several test glasses and several crystal resonators can be provided and be brought into specific positions. Furthermore is of advantage that the test glasses and the crystal resonators can readily be exchanged. If a test glass ring is utilized instead of several individual test glasses, the different positions of this test glass ring can be encountered reproducibly and repeatedly.

An embodiment example of the invention is shown in the drawing and will be described in further detail.

BRIEF DESCRIPTION OF THE INVENTION

Figure 2:
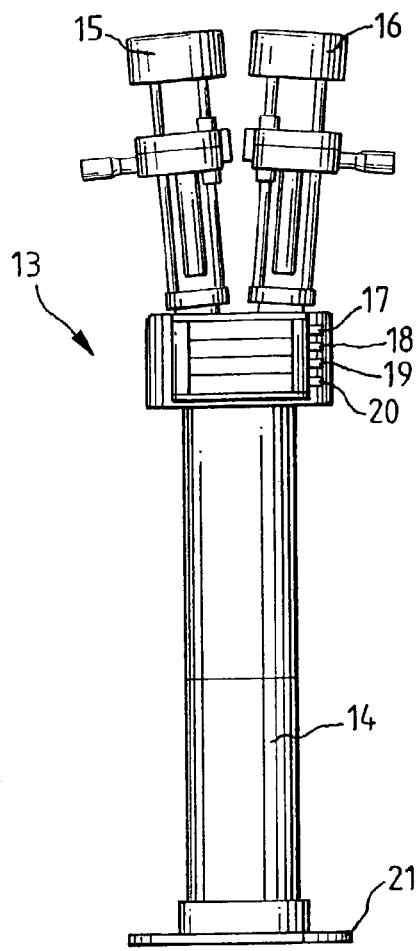
Figure 5:
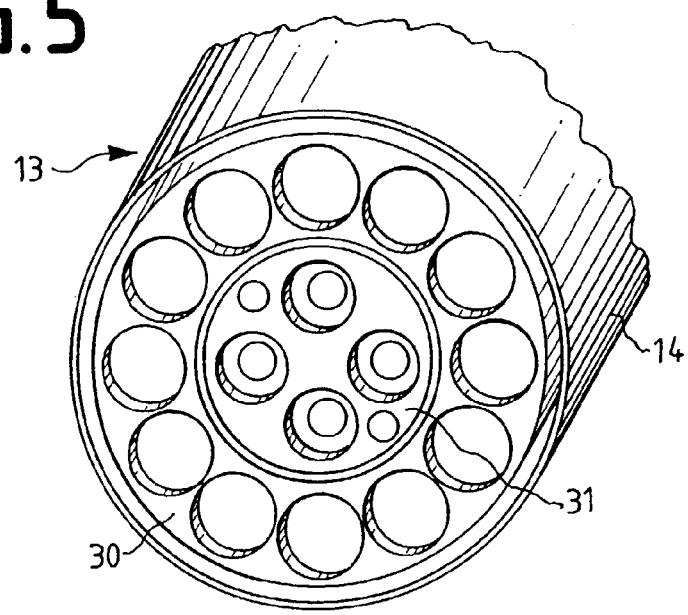
Figure 3:
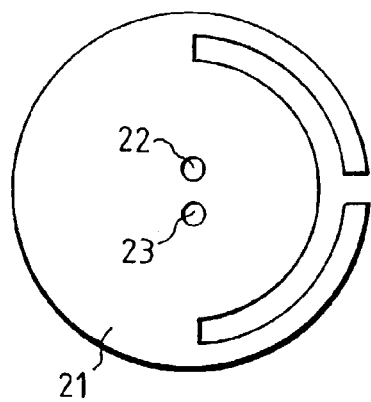
Figure 4:
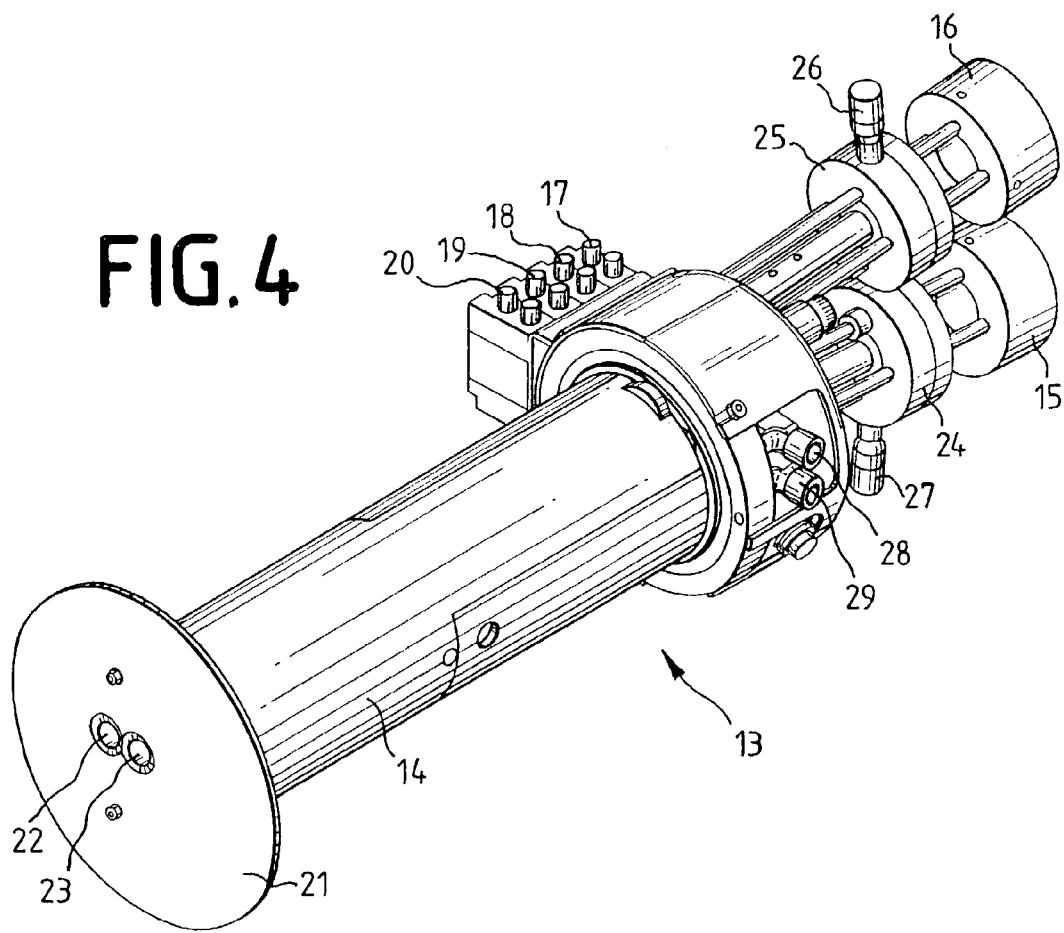
Figure 6:
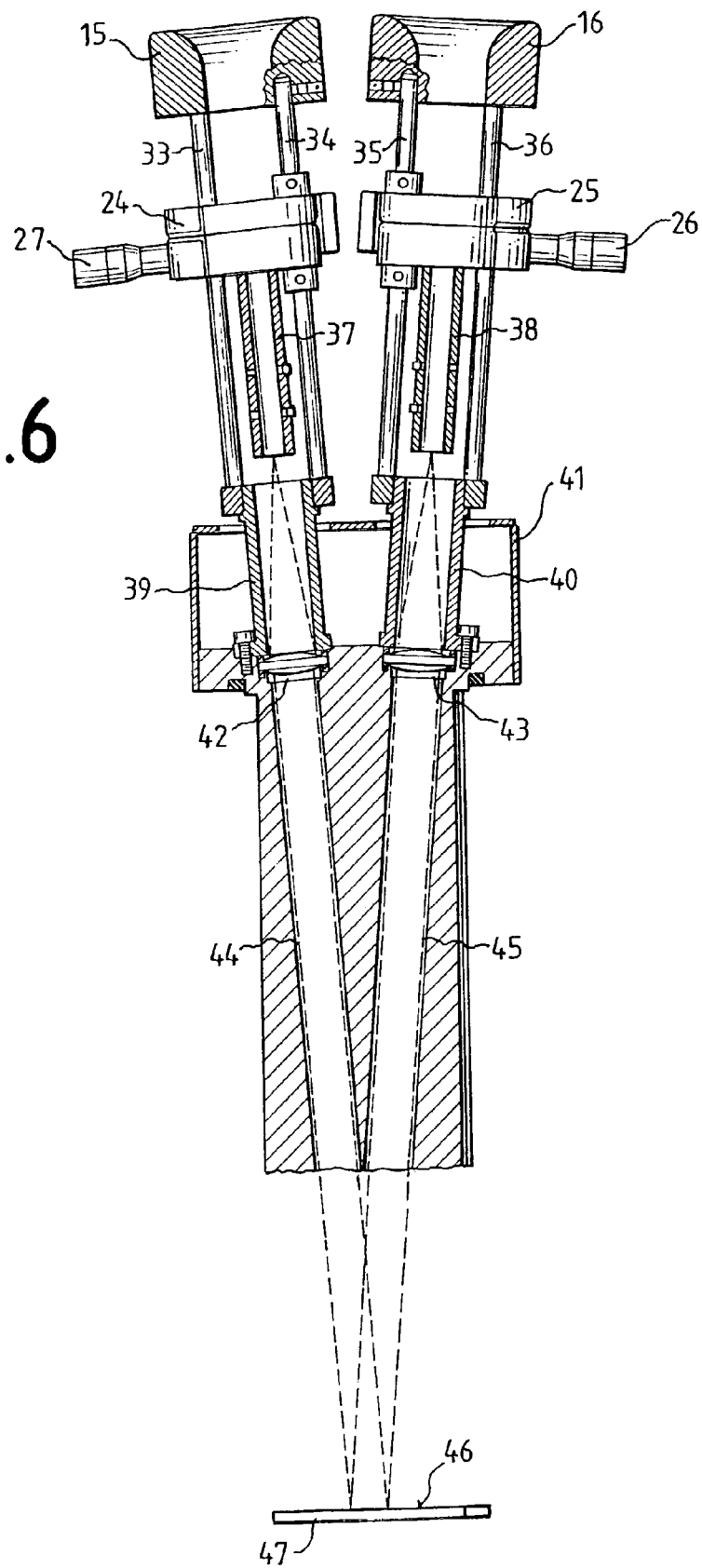
Figure 7:
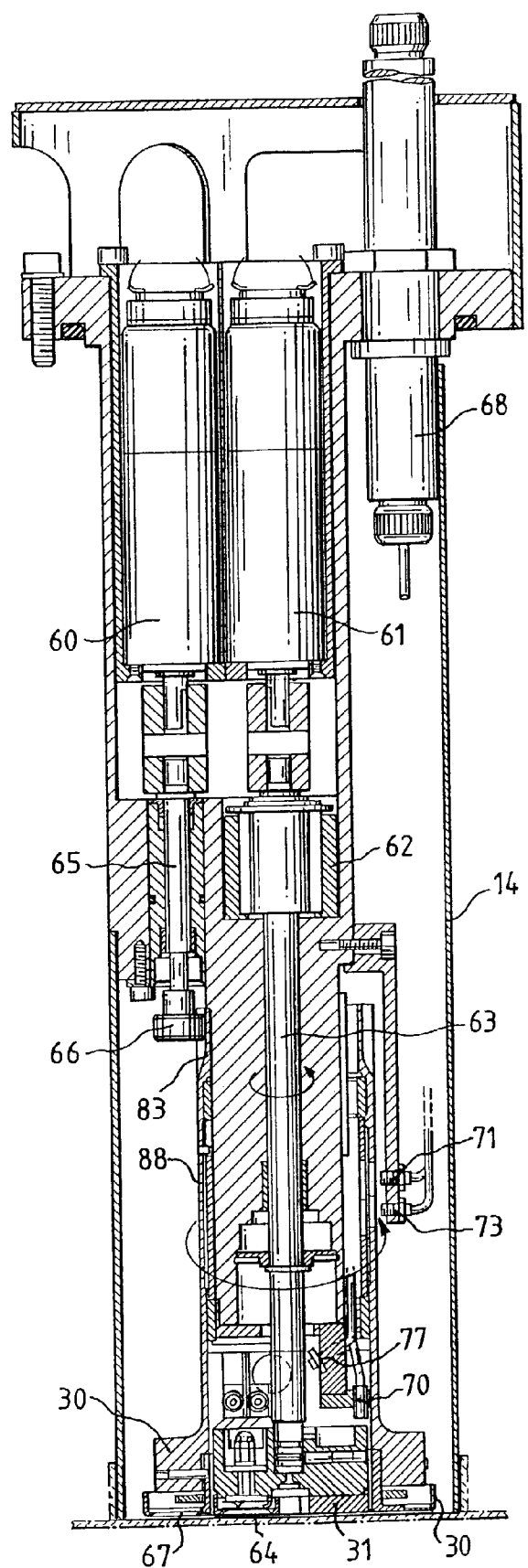
Figure 8:
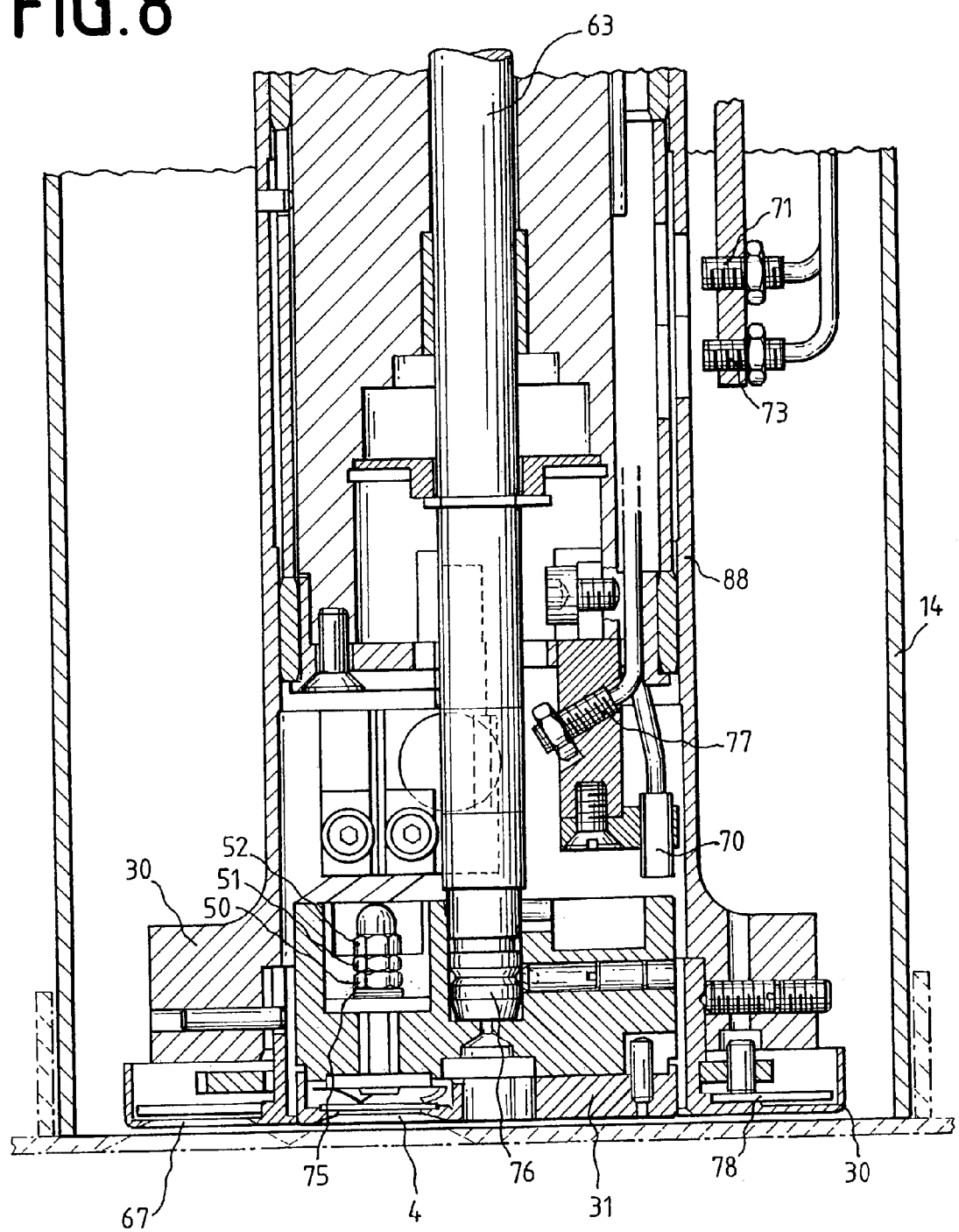
Figure 9:
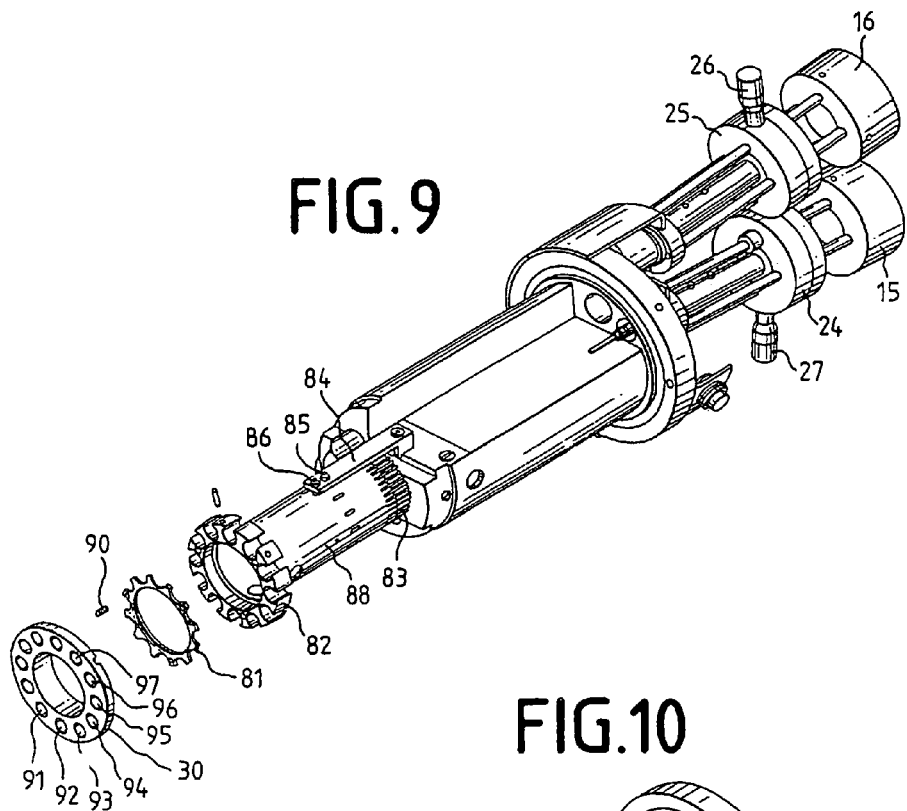
Figure 10:
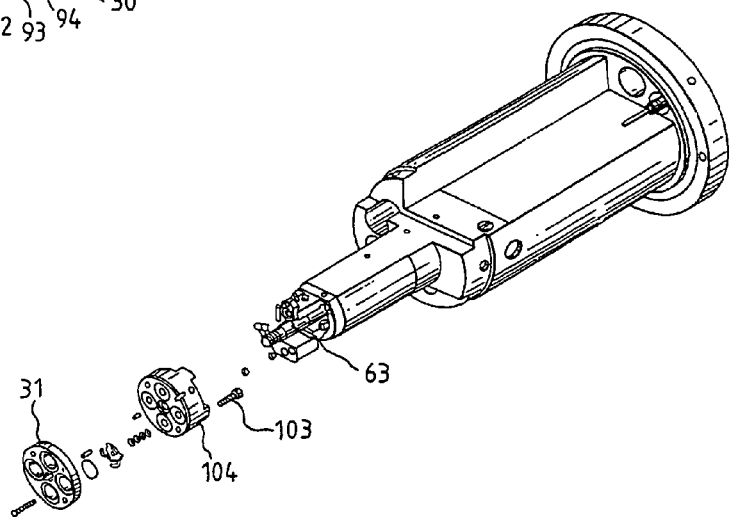

FIG. 1 a coating installation with the apparatus according to the invention,

FIG. 2 a side view of the apparatus,

FIG. 3 a view onto the underside of the apparatus,

FIG. 4 the apparatus in a perspective representation,

FIG. 5 a view onto the underside of the apparatus with the diaphragm removed,

FIG. 6 an enlarged representation of a light emitter and a light receiver,

FIG. 7 a section through the lower region of the apparatus according to FIG. 4,

FIG. 8 an enlarged representation of a portion of the apparatus according to FIG. 7, FIG. 9 an exploded view of an apparatus according to FIG. 4 to explain the changing of test glasses, FIG. 10 an exploded view of a portion of the apparatus according to FIG. 9 to explain the changing of crystal resonators.

DETAILED DESCRIPTION

In FIG. 1 a coating installation 1 is depicted, which comprises a housing 2, in which are disposed two electron beam vaporizers 3, 4 and a plasma source 5. The electron beams 6, 7 emerge from (not shown) electron beam sources and are curved through magnetic fields such that they impinge onto the material to be vaporized in the electron beam vaporizers 3, 4.

The vaporized material migrates upwardly and coats substrates disposed on substrate holders 8 to 10 and 55. These substrate holders 8 to 10 and 55 are mounted by special apparatus 11, 12. In the center of the substrate holders 8 to 10 or 55 is disposed the lower end of the apparatus 13 for devices for determining properties of vapor-deposited layers. This means that simultaneously with the substrate the lower region of the apparatus 13 is also coated. Since the location at which this region is located, is not identical with the locations of the substrates, a conversion factor must be drawn on in order to draw conclusions from the thickness of the layer disposed on the apparatus to the thickness of the layer on the substrates.

FIG. 2 shows once again the apparatus 13 in isolation. The apparatus 13 comprises a cylindrical sleeve 14, an optical emitter 15, an optical receiver 16 as well as four amplifiers 17 to 20 for four sensors, not shown in FIG. 2, and a diaphragm disk 21.

The diaphragm disk 21 is again depicted in FIG. 3 in a view from below. It can be seen that the diaphragm disk 21 has two throughbores 22, 23, with the throughbore 22 uncovering a glass plate and the throughbore 23 a crystal resonator. Glass plate and crystal resonator are not visible in FIG. 3.

FIG. 4 shows the apparatus 13 again in perspective view and from the side. Again the diaphragm disk 21 is evident with the two throughbores 22, 23, the cylindrical sleeve 14, the optical emitter 15, the optical receiver 16 as well as the amplifiers 17 to 20. Furthermore can be seen two measuring sliding devices 24, 25 with two adjusting screws each for the x-y adjustment of light waveguides, of which in FIG. 4 only one adjusting screw 26, 27 is shown. By 28, 29 are denoted water connections for the running in and out of cooling water. With the aid of the cooling water the crystal resonators are cooled. The test glass has substantially the temperature of the substrate (max. 300° C.). A high degree of isolation of the test glasses with respect to the crystal resonators is attained.

FIG. 5 shows a view from below onto the apparatus 13, with the diaphragm disk 21 removed. An outer ring 30 can be seen which is provided with twelve circular openings, as well as an inner disk 31 encompassed by the ring 30, which disk has four circular openings.

Into the openings of ring 30 are placed test glasses, while into the openings of disk 31 crystal resonators are placed. Instead of individual test glasses, a closed test glass ring can also be placed, which will yet be described. The outer ring 30 consequently contains test glasses for an optical measuring method. The outer ring 30 and the inner disk 31 are rotatable independently of one another. Thus, each of the four crystal resonators can be brought to the throughbore 23 and each of the twelve test glasses to the throughbore 22 of the diaphragm disk 21. The appearance of the rotating mechanism is represented in FIGS. 7 to 10 described in the following in further detail.

FIG. 6 shows the optical emitter 15 and the optical receiver 16 in a sectional representation on an enlarged scale compared to FIG. 2. By 44 is denoted a light beam which emerges from light waveguide fibers not shown in FIG. 6. The light waveguide fibers enter through the upper opening, extend parallel to and between elements 33, 34 and terminate at the lower end of bushing 37. The light beam 44 is projected via a lens 42 onto a thin layer 46 on a test glass 47, which is disposed in one of the recesses in ring 30. From there the light beam 44 is reflected as light beam 45 and, via lens 43, reaches a light waveguide disposed in a receiving bushing 38, which conducts it further to an evaluation device, which is not shown.

FIG. 7 shows the changing apparatus 13 according to FIG. 4, however without the optical emitter 15 and receiver 16.

In the cylindrical sleeve 14 are disposed two electrical geared motors 60, 61, of which the one geared motor 61 via a receiving bushing 62 for a needle (roller) bearing with free-wheeling and a shaft 63, rotates the crystal resonator magazine 64 with four crystal resonators. The other geared motor 60 rotates via a shaft 65, a driving gear 66 and a bushing 83 the ring 30 with the test glass 67. The bushing 83 and the ring 30 are part of a hollow shaft. By 68 is denoted a vacuum-side plug for four position sensors, of which two position sensors 71, 73 are evident in FIG. 7. The plug 68 establishes the connection between sensors 71, 73 and the amplifiers 17 to 20.

The lower portion of FIG. 7 is shown again in FIG. 8 but at an enlarged scale. Apart from sensors 71, 73, two further sensors 70, 77 are evident. The sensors 71, 73 serve for acquiring the current position and the zero position of a test glass, while sensors 70, 77 serve for acquiring the current position and the zero position of a crystal resonator. The sensors 70 involved are infrared light sensors serving as micro-light barrier.

As can be seen in FIG. 8 the test glasses and the crystal resonators are disposed in one plane. Therewith is attained the shadow-free disposition of the crystal resonator magazine 31 and ring 30 with the test glasses. Through the sensors 71, 73; 70, 77 in connection with an evaluation circuit not shown, it is possible to localize the individual positions of the test glasses and of the crystal resonators. Thus, a test glass in a specific position can be multiply coated. This multiple utilizing of a test glass in a specific position entails advantages with respect to the length of the process, since the process for changing of the ring 30 for test glasses does not need to be interrupted.

By 75 is denoted a hexagon nut beneath which are disposed five plate springs 50 to exert a defined pressure onto the ceramic disk disposed beneath. Above the nut 75 is disposed a further nut 51, which counters the superjacent contact nut 52. By 76 is denoted a driving shaft for the crystal resonator magazine 31 and by 78 a test glass. On the test glass 78 is reflected a light beam.

FIG. 9 shows the way in which the test glasses are exchanged. For this purpose the threaded pins 90 are loosened, a disk 81 rotated until disengaged and subsequently lifted. Now the test glasses in bores 91 to 97 are exchanged. Disk 81 is subsequently placed on again and rotated until aligned. Three threaded pins—in FIG. 9 only one threaded pin 90 is shown—are now tightened. By 82, 83 are denoted parts of the driving sleeve 88 for the test glass magazine. Above this driving sleeve 88 is disposed a sensor holder 84, wherewith the sensors 71, 73, not visible in FIG. 9, are connected with the sensor holder 84 by means of nuts 85, 86.

In a variant of the test glass magazine a device is provided with an inner tubular part and an outer tubular part, with the height of the inner part being greater than that of the outer part. A receiving ring for test glasses is subsequently placed between the two tubular parts. This receiving ring comprises several circular and equidistant cutouts over the circumference. Onto this receiving ring is subsequently placed a test glass ring, i.e. no circular individual test glasses are employed but rather a closed test glass ring. Onto this test glass ring is subsequently also set a contact ring.

In FIG. 10 is shown the way in which the crystal resonators are exchanged. Two cylinder screws are loosened, of which only one cylinder screw 103 is shown. Hereupon the disk 31 serving as crystal resonator holder is pulled off, the crystals are removed and new crystals are emplaced. The crystal resonator holder 31 is subsequently connected by screws with a basic body 104.

What is claimed is:

1. Apparatus for devices for determining properties of applied layers, comprising:
 a rotatable test glass magazine with at least two discrete test glasses;

a rotatable crystal resonator magazine with at least two crystal resonators, with one magazine being disposed within the other magazine.

2. An apparatus as claimed in claim 1, wherein the discrete test glasses are realized by individual glasses, which are placed into corresponding receptions in the test glass magazine.

3. An apparatus as claimed in claim 1, wherein the discrete test glasses are realized by a closed test glass ring, which resides on a diaphragm with corresponding recesses.

4. An apparatus as claimed in claim 1, wherein the rotatable test glass magazine is developed such that it has the form of a ring.

5. An apparatus as claimed in claim 1, wherein the rotatable crystal resonator magazine is a disk.

6. An apparatus as claimed in claim 1, wherein the determination of physical properties of the applied layer an optical emitter and an optical receiver are provided, with the optical emitter projecting a light beam onto a test glass and the receiver receives the light reflected from the test glass.

7. An apparatus as claimed in claim 1, wherein the determination of the coating rate a crystal oscillator is provided whose crystal is disposed in the crystal resonator magazine.

8. An apparatus as claimed in claim 1, wherein the crystal resonator magazine is rotatable by means of a geared motor which, via a shaft, is coupled with the magazine.

9. An apparatus as claimed in claim 8, wherein the bushing associated with the test glass magazine encompasses the shaft associated with the crystal resonator magazine.

10. An apparatus as claimed in claim 1, wherein the test glass magazine is rotatable by means of a geared motor, a shaft with a driving gear and a bushing.

11. An apparatus as claimed in claim 10, wherein the bushing associated with the test glass magazine encompasses the shaft associated with the crystal resonator magazine.

12. An apparatus as claimed in claim 1, wherein the crystal resonator magazine and the test glass magazine are developed as a changing magazine.

13. An apparatus as claimed in claim 1, wherein each of the two magazines are associated two sensors, of which the one sensor serves for position recognition and the other sensor for zero position recognition.

14. An apparatus as claimed in claim 1, wherein the test glass magazine is an annulus which comprises twelve equidistantly disposed test glasses.

15. An apparatus as claimed in claim 1, wherein the crystal resonator magazine comprises four equidistantly disposed crystal resonators.

* * * * *